United States Patent
Roubadia et al.

(10) Patent No.: US 7,339,439 B2
(45) Date of Patent: Mar. 4, 2008

(54) VOLTAGE-CONTROLLED OSCILLATOR WITH MULTI-PHASE REALIGNMENT OF ASYMMETRIC STAGES

(75) Inventors: Regis Roubadia, Trets (FR); Sami Ajram, Marseilles (FR)

(73) Assignee: Atmel Corporation, San Jose, CA (US)

(*) Notice: Subject to any disclaimer, the term of this patent is extended or adjusted under 35 U.S.C. 154(b) by 101 days.

(21) Appl. No.: 11/456,752

(22) Filed: Jul. 11, 2006

(65) Prior Publication Data
US 2007/0013455 A1   Jan. 18, 2007

Related U.S. Application Data

(63) Continuation-in-part of application No. 11/183,346, filed on Jul. 18, 2005, now Pat. No. 7,126,432.

(30) Foreign Application Priority Data
Apr. 5, 2006   (FR)   ................... 06 03010

(51) Int. Cl.
*H03B 5/24*   (2006.01)
*H03L 7/087*   (2006.01)
*H03L 7/099*   (2006.01)

(52) U.S. Cl. ............... 331/57; 331/8; 331/11; 331/17; 331/34; 331/177 R

(58) Field of Classification Search ............... 331/1 A, 331/8, 10–11, 17–18, 25, 34, 57, 177 R; 327/156–159
See application file for complete search history.

(56) References Cited

U.S. PATENT DOCUMENTS
4,733,200 A   3/1988   Ecklund et al.

(Continued)

FOREIGN PATENT DOCUMENTS
WO   WO03/063337 A1   7/2003

OTHER PUBLICATIONS

T.H. Lee et al., "Oscillator Phase Noise: A Tutorial", IEEE Journal of Solid-State Circuits, vol. 35, No. 3, Mar. 2000, pp. 326-336.

(Continued)

*Primary Examiner*—David Mis
(74) *Attorney, Agent, or Firm*—Schneck & Schneck; Thomas Schneck

(57) ABSTRACT

A multi-phase realigned voltage-controlled oscillator (MRVCO) achieves phase realignment based on charge injection in the VCO stages. The individual VCO stages provide an oscillating output signals having an asymmetric waveform with substantially different rise and fall times. This ensures that the VCO as a whole has a multiphase impulse response to the charge injection that is strictly positive or strictly negative, and substantially constant so as to be independent of the VCO phase or timing of charge injection. The MRVCO may form a component part of an implementation of a multi-phase realigned phase-locked loop (MRPLL).

25 Claims, 9 Drawing Sheets

U.S. PATENT DOCUMENTS

| | | | |
|---|---|---|---|
| 4,761,616 A | 8/1988 | Ash | |
| 5,061,907 A | 10/1991 | Rasmussen | |
| 5,115,212 A | 5/1992 | Fenk et al. | |
| 5,485,128 A | 1/1996 | Azuma | |
| 5,495,205 A | 2/1996 | Parker et al. | |
| 5,847,616 A | 12/1998 | Ng et al. | |
| 6,148,052 A | 11/2000 | Bogdan | |
| 6,188,291 B1 | 2/2001 | Gopinathan et al. | |
| 6,353,368 B1 | 3/2002 | Iravani | |
| 6,417,740 B1 | 7/2002 | Anh et al. | |
| 6,466,100 B2 | 10/2002 | Mullgrav, Jr. et al. | |
| 6,617,936 B2 | 9/2003 | Dally et al. | |
| 6,621,360 B1 | 9/2003 | Xu et al. | |
| 6,650,190 B2 | 11/2003 | Jordan et al. | |
| 6,683,506 B2 | 1/2004 | Ye et al. | |
| 7,020,229 B2 | 3/2006 | Lindner et al. | |
| 7,126,432 B2 * | 10/2006 | Roubadia et al. | 331/57 |

OTHER PUBLICATIONS

F.M. Gardner, "Charge-Pump Phase-Lock Loops", IEEE Transactions on Communications, vol. Com-28, No. 11, Nov. 1980, pp. 1849-1858.

A. Hajimiri et al., "Jitter and Phase Noise in Ring Oscillators", IEEE Journal of Solid-State Circuits, vol. 34, No. 6, Jun. 1999, pp. 790-804.

N. Retdian et al., "Voltage Controlled Ring Oscillator with Wide Tuning Range and Fast Voltage Swing", IEEE, Asia-Pacific Conference on ASICs, Aug. 6-8, 2002, Taipei, Taiwan, 4 pages.

T. Pialis et al., "Analysis of Timing Jitter in Ring Oscillators Due to Power Supply Noise", 2003 IEEE Int'l Symposium on Circuits and Systems, May 25-28, 2003, Proceedings, vol. 1, pp. 681-684.

Website printout: "Low-Phase Noise CMOS Ring Oscillator VCOs for Frequency Synthesis", R.J. Betancourt Zamora and T.H. Lee, SMIRC Laboratory, Stanford Univ., http:// www-smirc.stanford.edu., Jul. 27, 1998, 19 pgs.

* cited by examiner

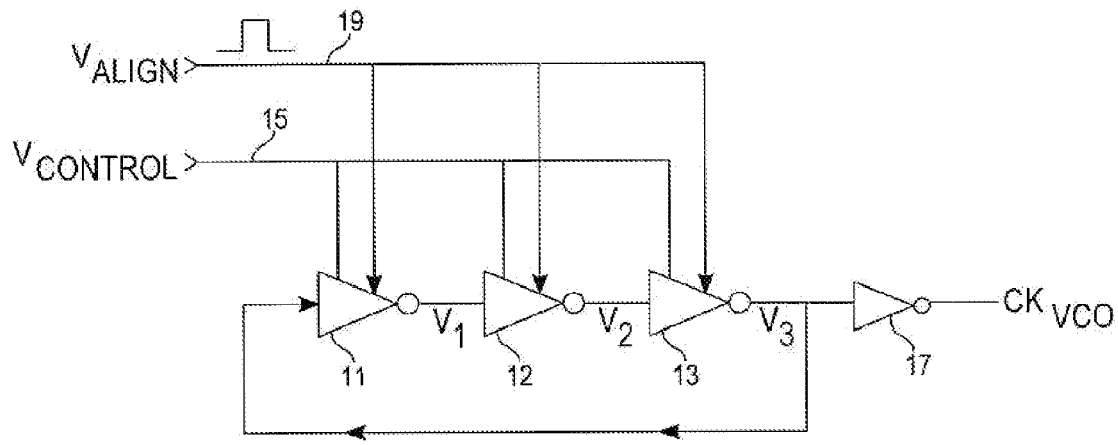
Fig. _ 1
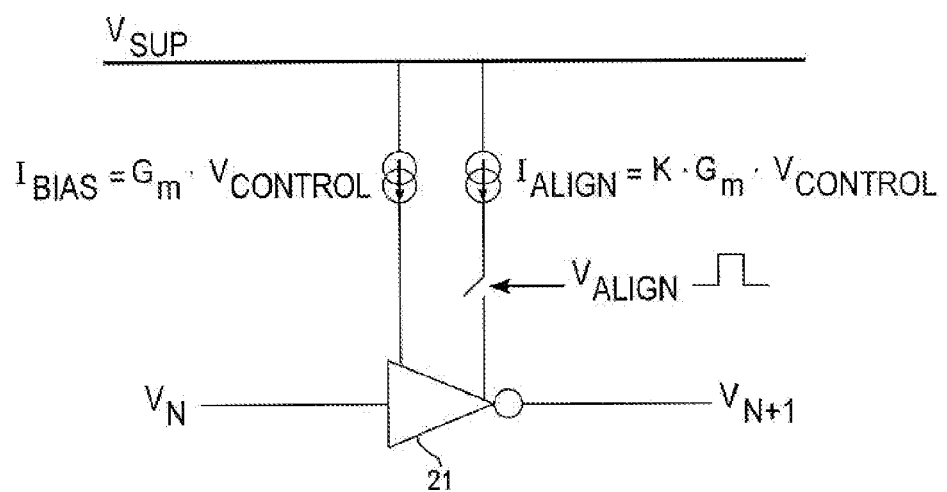
Fig. _ 2

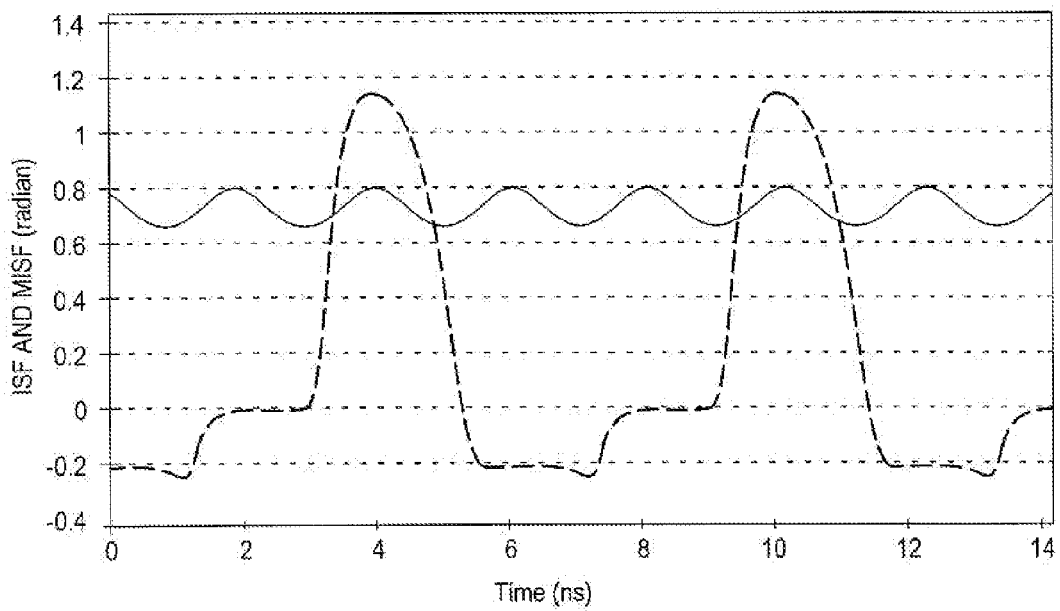
Fig._5
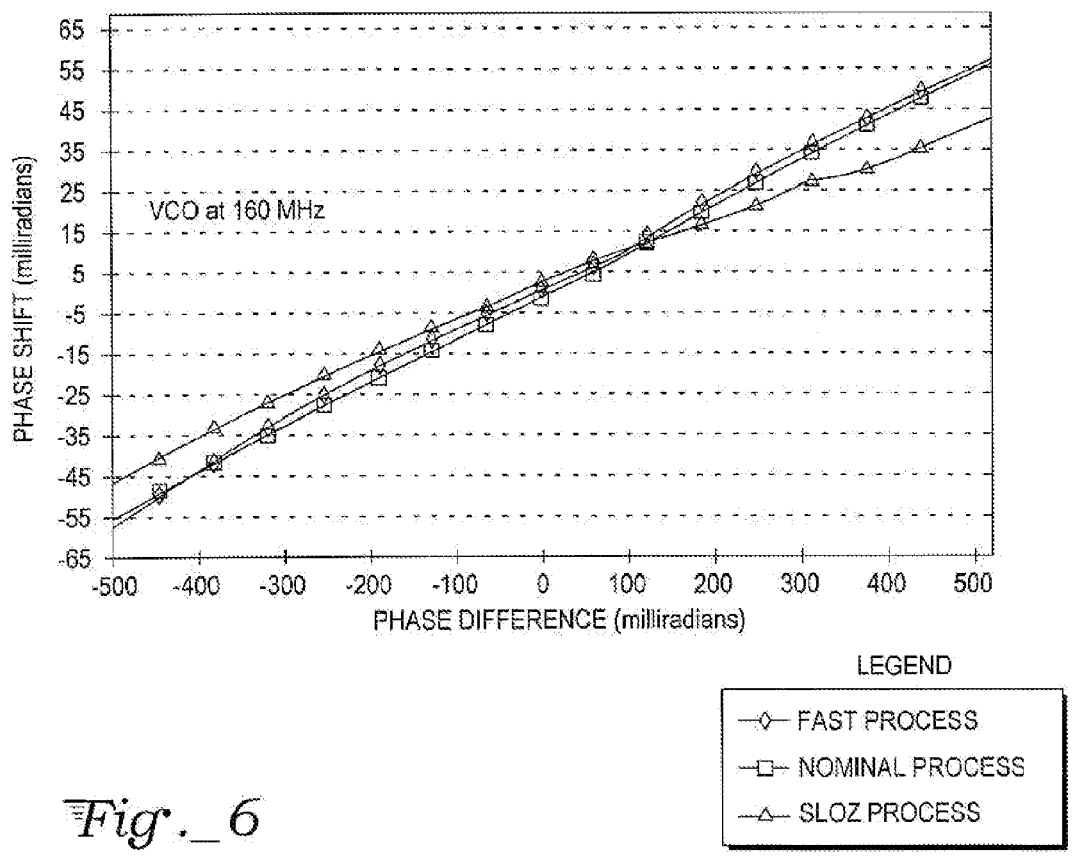
Fig._6

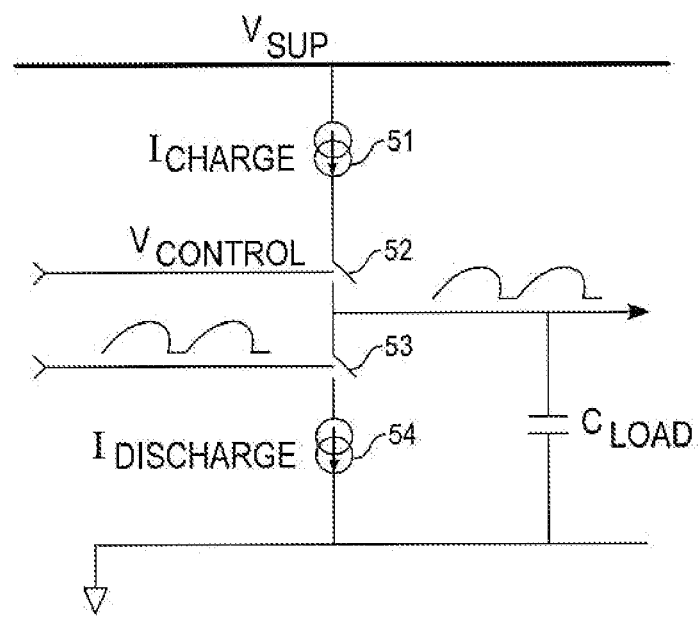
*Fig._7A*
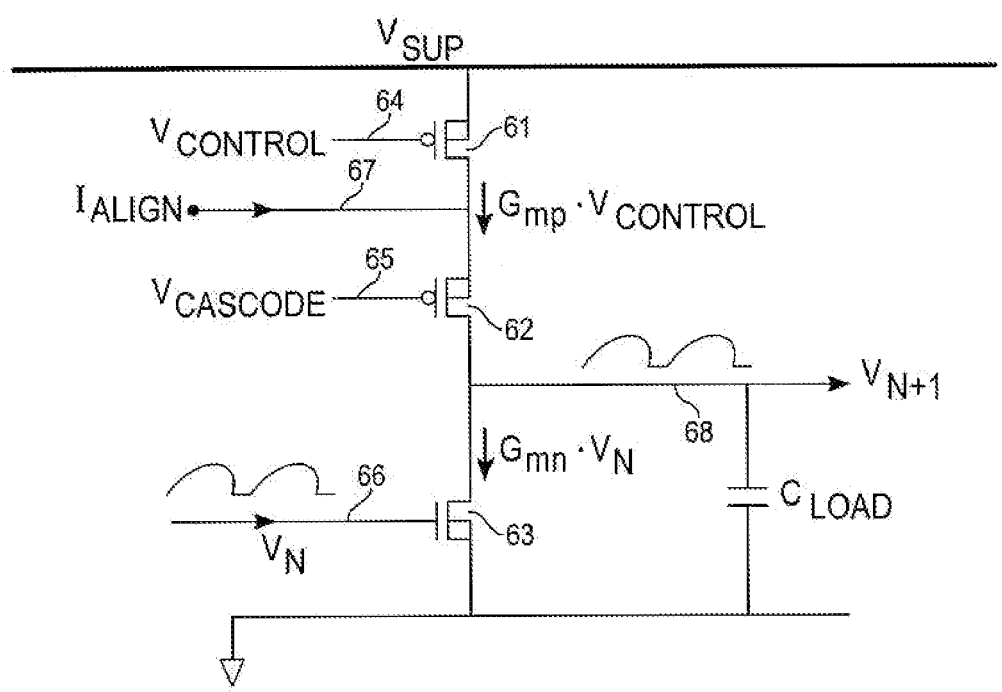
*Fig._7B*

Fig._9

VOLTAGE-CONTROLLED OSCILLATOR WITH MULTI-PHASE REALIGNMENT OF ASYMMETRIC STAGES

CROSS-REFERENCE TO RELATED APPLICATION

This is a continuation-in-part of prior U.S. application Ser. No. 11/183,346, filed Jul. 18, 2005, now U.S. Pat. No. 7,126,432.

TECHNICAL FIELD

The present invention relates to voltage-controlled oscillator (VCO) circuits, especially those of the ring oscillator type, characterized by recurring phase realignment with respect to a reference signal. The invention also relates to phase-locked loops containing such a VCO as a component itself.

BACKGROUND ART

In classical VCO structures, low-frequency phase modulation (PM) noise, or long-term jitter, is significant and cumulative. Phase-locked loop (PLL) circuits using this kind of VCO are able to correct this PM noise or jitter only up to a modulation frequency equal to that of the PLL band width. At higher modulation frequencies, the PLL circuit stops regulating and so the PM noise is equal to or slightly higher than the intrinsic PM noise of the VCO. Reducing high frequency PM noise, short-term jitter, requires either a very large PLL bandwidth or a low noise VCO. Enlarging the PLL bandwith is limited by the fact that the bandwidth cannot exceed about $\frac{1}{20}^{th}$ of the reference frequency, due to quantization noise. Hence, low noise VCO circuits are sought.

Phase realignment in a VCO circuit allows synchronizing its phase to that of a reference clock signal. In particular, the VCO clock edge may be resynchronized to each reference clock edge. This resynchronization has been realized by inserting realignment inverters having specific phase delays into the VCO ring. See, for example, the published international (PCT) patent application WO 03/063337A1 of Sheng et al. A realignment signal is obtained by combining the VCO circuit's clock output with a reference clock. This realignment signal is applied to one of the realignment inverters to force a transition at the reference clock edge. PLL circuits that use a phase-realigned VCO have reduced PM noise or jitter to significantly higher frequencies than comparable simple PLL circuits.

However, this technique also requires sophisticated digital gating and timing skewing between the VCO clock output, reference clock and realignment signal in order to apply the phase realignment at the optimum instant. The phase realignment factor, which is defined as the induced realignment phase shift divided by the difference between the VCO and reference phases just prior to the realignment instant, is minimally dependent on device performance spread and mismatch. The addition of realignment inverters adds phase delay to the VCO ring and thus decreases the VCO circuit's maximum operating frequency. The device parameters in any VCO circuit embodiment are specific to the design operating frequency, and hence this particular phase realignment technique is not applicable where a VCO circuit with a wide frequency range is desired.

In U.S. Pat. No. 5,495,205, Parker et al. describe a digital controlled oscillator where the individual stages include coarse and fine frequency tuning based on a capacitor load adjustment for each inverter in the oscillator ring. Varying the load capacitors of the ring inverters adjusts the propagation delay through the stages. Frequency tuning of the oscillator is based on a lag/lead flag generated by a phase detector. Additionally, phase realignment may be applied to one stage, based on a RESET signal. The single-stage phase realignment factor is strictly equal to one and fully resets the phase of the oscillator. An advantage of this construction is that it achieves a relatively large bandwidth for a VCO at moderate operating frequencies. But, the system is too slow for operations at high frequencies.

SUMMARY DISCLOSURE

The present invention uses parallel charge injection into each stage of a VCO circuit to apply a distributed and simultaneous phase shift to each stage in the ring at the instant the alignment is necessary. Each of the individual stages generates a waveform in which the rise times differ from the fall times. As a result of this rise-fall asymmetry in the waveforms from the individual stages, a multiphase impulse sensitivity response function is obtained for the VCO circuit as a whole that is both strictly positive (or, strictly negative) and also relatively constant in time. Short current impulses are applied in parallel to each of the stages in order to induce phase shifts at the output of each stage relative to the phase angle before the realignment. Although the magnitude and direction of the phase shift obtained from each individual stage will depend upon the instantaneous phase of the particular stage, the relatively constant multiphase response allows an overall phase shift from the VCO as a whole that is largely independent of the timing of those current impulses. Accordingly, phase realignment is readily achieved without needing any special synchronization between the reference clock and the VCO internal signals or clock output signal.

More generally, the invention comprises a free-running oscillating system that can be externally synchronized in phase to a reference oscillation by means of multiple realignment impulses. These impulses are applied in parallel to stages separated by equal phase distribution. The individual stages present a periodic impulse sensitivity response, which, in a Fourier domain, has a magnitude of a DC coefficient (defined as a mean value of the response function over a period) that is at least twice that of a Nth harmonic coefficient. The plurality of stages collectively present a response with suppressed $1^{st}$ through (N−1) harmonic coefficients, which is strictly positive (or strictly negative) and is substantially constant over a full phase period.

BRIEF DESCRIPTION OF THE DRAWINGS

FIG. 1 is an exemplary basic schematic view of a multiphase realigned voltage-controlled oscillator of the present invention, here exemplified by a 3-stage ring oscillator.

FIG. 2 is a basic schematic view of an individual stage of the oscillator of FIG. 1.

FIG. 5 is a graph of impulse sensitivity response functions (ISF and MISF) for an individual VCO ring stage (dashed curve) and for the entire VCO (solid curve), for a VCO circuit embodiment shown in FIG. 8.

FIG. 6 is a graph of VCO output phase shifts due to realignment, expressed in milliradians at 160 MHz, versus the phase error detected between the VCO clock output and a reference clock, for three fabrication processes for the VCO circuit embodiment shown in FIG. 8.

FIGS. 7A and 7B are schematic circuit diagrams respectively illustrating a general theoretical construction and a practical implementation for an individual VCO stage that will generate an asymmetrical waveform for use in a VCO circuit in accord with the present invention, such as in the embodiment of FIG. 8.

DETAILED DESCRIPTION

Figure 3:
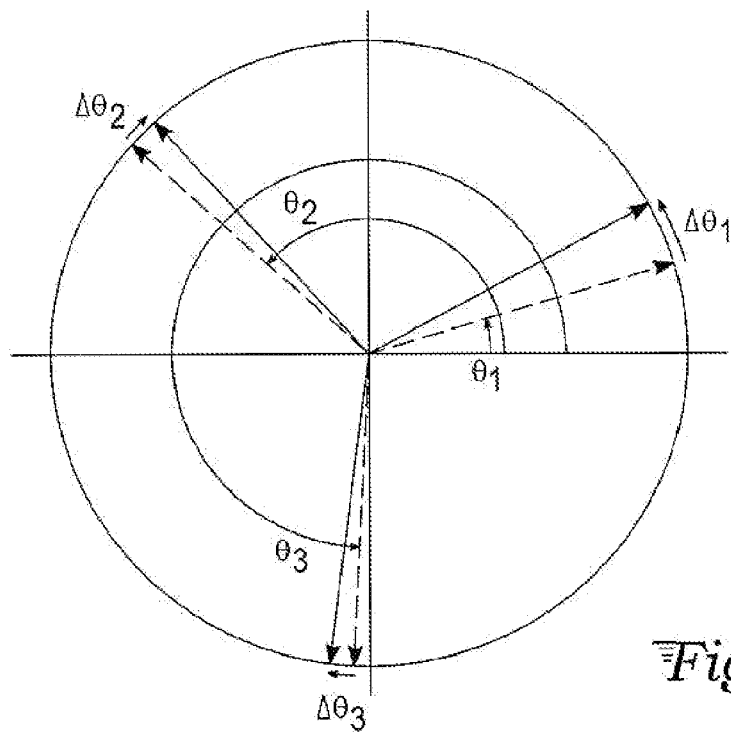
FIG. 3 is a phase diagram showing the phase shifts (Δϕ) of the individual stages due to respective short current impulses that inject charge into each of the stages.

With reference to FIG. 1, a three-stage ring voltage-controlled oscillator (VCO) circuit includes a series of inverting stages 11, 12, and 13, with the output of the third stage 13 coupled back to the input of the first stage 11. Each of the stages 11, 12, and 13 outputs an oscillating voltage, $V_1$, $V_2$, and $V_3$, respectively, which will be essentially periodic over time. The number of stages can vary.

The oscillation frequency of the output voltages, $V_1$, $V_2$, and $V_3$, depends on the propagation delay through one cycle of the ring and can be adjusted to a target frequency using a control voltage $V_{CONTROL}$ applied via a control input line 15 to each of the stages 11, 12, and 13. The oscillating output voltages from the three stages will have relative phases that tend to be 120° apart (except immediately after a realignment impulse).

A high gain output stage 17 drives the signal received from the ring stages to saturation so that it generates a VCO clock output $CK_{VCO}$ that is essentially a square wave with the same frequency as that of the ring.

Each ring stage, 11, 12, and 13, also receives a short realignment pulse $V_{ALIGN}$ via a second control input 19 whenever phase realignment of the VCO output $CK_{VCO}$ is deemed necessary. In this way, realignment current pulses are applied in parallel to all stages of the VCO ring, and the associated parallel charge injection into each stage causes simultaneous and distributed phase shifts to each stage of the ring.

Referring to FIG. 2, each VCO ring stage 21 is characterized by a propagation delay or relative phase between its input voltage signal $V_N$ and its inverted output voltage signal $V_{N+1}$ that is proportional to total injected current. This includes a VCO bias current $I_{BIAS}$, which is proportional to the control voltage $V_{CONTROL}$, plus an additional contribution from the alignment current pulse $I_{ALIGN}$, which is switched on and off by the $V_{ALIGN}$ pulse. A circuit designer can optimize the relative amount of the realignment phase shift for a given output-to-reference clock phase difference by increasing the charge injection amplitude proportionally to the bias current $I_{ALIGN}/I_{BIAS}$ (represented by the factor k).

Figure 4:
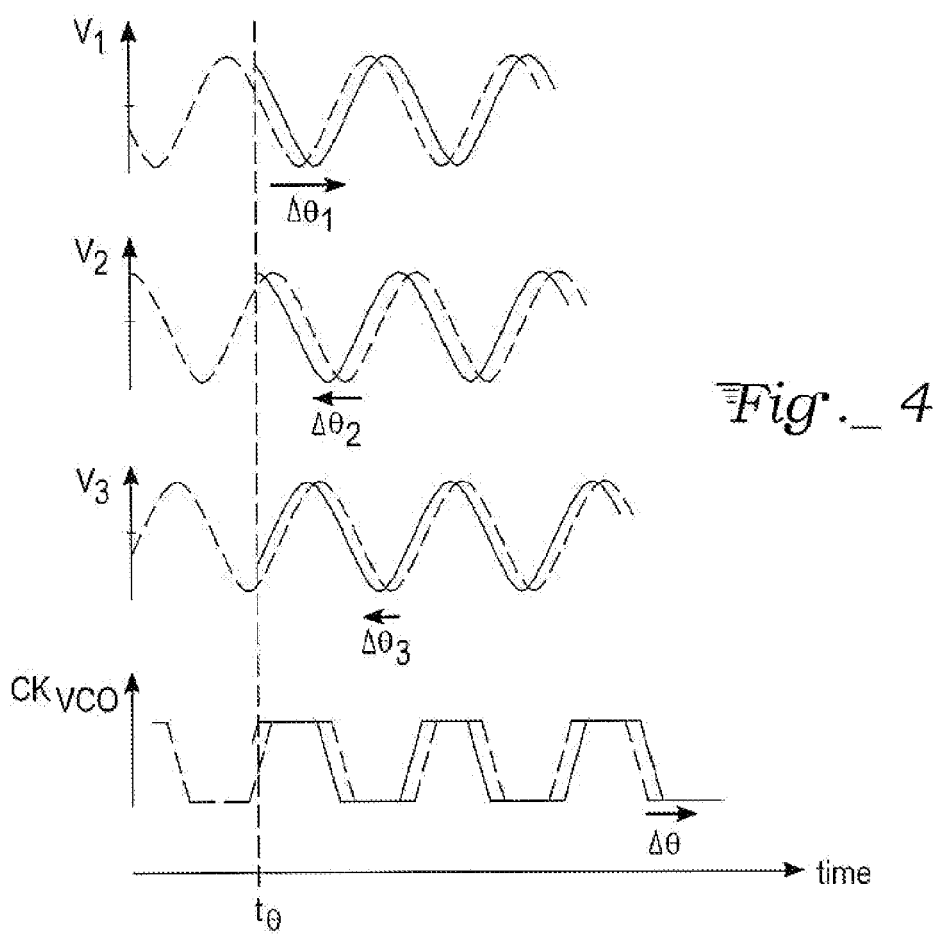
FIG. 4 is a graph of an output voltage signal from each stage ($V_1$, $V_2$, $V_3$), and of the VCO clock output signal ($CK_{VCO}$), versus time, where the dashed curves represent the output voltages prior to realignment, and where the solid curves represent the output voltages after the realignment.

With reference to FIGS. 3 and 4, the three stages of the VCO ring tend to operate with a relative phase difference between them of 120°. Although the stages may deviate slightly from this tendency, particularly immediately after a phase readjustment, as the oscillating input and output voltages $V_1$, $V_2$, and $V_3$ propagate through the stages in the ring the relative phases will adjust so as to approach and then maintain themselves at or near 120°. In VCO ring oscillators with some other number of stages, the relative phases will differ, but will tend to equalize and cumulatively sum to 360° (e.g., a 72° relative phase difference between stages of a 5-stage ring). The dashed vectors in phase diagram of FIG. 3 and the relative displacement of the dashed sinusoidal curves in FIG. 4 illustrate this relative difference in the phases ($\phi_1$, $\phi_2$, $\phi_3$) of the outputs ($V_1$, $V_2$, $V_3$) from each stage prior to a phase realignment pulse. The VCO clock output CKVCO will be trapezoidal or nearly square-wave in form and will have a phase of its transitions that is slightly later than that of the zero crossings of the voltage output $V_3$ from third stage in the ring, due to a slight, but substantially constant, propagation delay in the output stage, as represented in FIG. 4.

A realignment current impulse is applied at a time $t_0$ to all ring stages in parallel. This produces a distributed and simultaneous phase shift at the output of each stage in the ring. However, the phase shifts ($\Delta\phi_1$, $\Delta\phi_2$, $\Delta\phi_3$) from the different stages are not necessarily equal, nor even necessarily in the same direction, even if the stages are otherwise structurally identical, because they are at different relative phases at the time $t_0$ of the realignment impulse. For example, the immediate result of a phase realignment impulse, represented as solid vectors in the phase diagram of FIG. 3 and the solid sinusoidal curves in FIG. 4, show a case where the phase shift $\Delta\phi_1$ from the first ring stage is in a positive (counterclockwise) direction, while the phase shifts $\Delta\phi_2$ and $\Delta\phi_3$ from the second and third ring stages are in a negative (clockwise) direction, and where $\Delta\phi_1$ is relatively larger than either of $\Delta\phi_2$ or $\Delta\phi_3$. The particular result will vary depending upon the instant that the realignment current pulse is applied. Nevertheless, the eventual result at the VCO clock output $CK_{VCO}$ will, after the oscillating voltage signal has had a chance to propagate through all stages of the ring and adjust toward a new 120° relative phase difference between the stages, be an average of the three individual phase shifts distributed among the three stages. In the example shown in FIG. 4, this average is a slight positive phase shift $\Delta\phi$ in the VCO clock output $CK_{VCO}$.

The concept of an impulse sensitivity response function (ISF) that is a characteristic for each individual VCO ring stage can be adapted to arrive at a multiphase impulse sensitivity response function (MISF) for the VCO ring as a whole. The ISF for any given VCO ring stage at any given moment in time is defined as the ratio of the instantaneous phase shift produced at the VCO output divided by the relative charge quantity injected by the very short current impulse $I_{ALIGN}$ into that stage. The relative charge quantity is calculated by reference to the total charge swing exchanged between the stage and its load capacities over one oscillation period. That is, the impulse sensitivity response function $$ISF(t) = (\Delta\phi(t)/\Delta q \cdot i_L(t)dt,$$

where the integration is over one entire oscillation period (a range from 0 to $T_0$), $\Delta\phi(t)$ is the time-dependent phase shift induced at the individual stage output, $\Delta q$ is the charge quantity injected into the VCO stage at the realignment instant, $i_L(t)$ is the load current of the stage.

The ISF is a periodic time function having the same frequency as the VCO circuit's ring oscillation frequency. The sign of the ISF depends on the instant that the current impulse is applied. For example, it may be positive at rising signal slopes and negative at falling ones. However, the magnitude will usually not be the same for the positive and negative portions of the ISF curve. FIG. 5 shows an ISF of an individual stage (the dashed curve) for the VCO embodiment of FIG. 7. The ISF curves for the other stages in a VCO will be substantially identical, but staggered in time by a fraction 1/N of the ISF period, where N is the number of stages in the VCO ring.

The multiphase impulse sensitivity response function (MISF) is defined as the ratio of the overall phase shift of the VCO output clock divided by the relative charge quantity injected simultaneously by very short current impulses into all ring stages of the VCO. The equation given above for the ISF also applies to the MISF, except that $\Delta q$ is the total charge quantity injected into all of the ring stages.

To establish the relationship between the ISF and the MISF, we can develop the individual ISF for the various stages as follows:

$$ISF_k(t) = ISF_0(t - kT_0/N),$$

where $ISF_0(t)$ is the ISF of the first stage, k is the stage index (0 to N−1), and $T_0$ is the oscillating period. Assuming $ISF_0(t)$ may be developed using a Fourier transform as follows:

$$ISF_0(t) = C_0/2 + \sum_n C_n \cos(n\omega_0 t + \varphi_n),$$

with amplitude and phase coefficients $C_n$ and $\phi_n$ and with the transform index n ranging from 1 to ∞, we can easily derive the corresponding $ISF_k(t)$ for the subsequent stages as follows:

$$ISF_k(t) = C_0/2 + \sum_n C_n \cos(n\omega_0 t + 2\pi kn/N + \varphi_n).$$

Combining the ISF of the N stages provides the following MISF expression:

$$MISF(t) = \sum_k ISF_k(t)$$
$$= NC_0/2 + \sum_k \sum_n C_n \cos(n\omega_0 t + 2\pi kn/N + \varphi_n).$$

Finally, taking into account that $$\sum_k C_n \cos(n\omega_0 t + 2\pi kn/N + \varphi_n) = N \cos(n\omega_0 t + \varphi_n)$$

whenever n is a multiple of N, i.e., for n=Nm for an index m from 1 to ∞, and equal to 0 in all other cases, we then obtain the relationship between MISF and the ISF Fourier coefficients as:

$$MISF(\omega_0 t) = NC_0/2 + N \sum_m C_{Nm} \cos(Nm\omega_0 t + \varphi_{Nm}).$$

As a consequence we can see that, whereas ISF is a periodic function oscillating at the VCO frequency, the MISF is also a periodic function, but its frequency equals the VCO frequency multiplied by the number of stages, N. That is, MISF has a frequency N-fold higher than the VCO frequency. Multiphase realignment sensitivity, $NC_0/2$, is also N-fold higher than the corresponding single-impulse sensitivity, $C_0/2$, of prior VCO circuits. (N=3 in the exemplary three-stage ring VCO circuit seen in the drawings.)

Assuming the DC value $C_0$ of the ISF is higher than the $N^{th}$ harmonic value $C_N$, the resulting MISF will be an almost constant function with very low ripple, so that the induced phase shift will not vary much depending on the injection instant. For $C_0$ at least twice $C_N$, MISF is also either strictly positive or strictly negative, so that its sign (the direction of the overall realignment phase change) does not depend on the injection instant. FIG. 5 shows a strictly positive and quite constant MISF (solid curve) for the exemplary VCO embodiment described below. The small amount of ripple reflects the presence of a $3^{rd}$ harmonic value in the MISF for the exemplary embodiment. Although this MISF characteristic of a VCO would not be suitable for reducing phase noise if the VCO were operated in a free-running mode, it does achieve better performance in a multi-phase realigned mode. An advantage of a nearly constant MISF is that phase realignment can be realized without any special synchronization between the reference clock and the VCO internal signals or output clock. One does not really care at what instant during an oscillation cycle the realignment impulse is applied.

A key then in achieving these desirable results is in relaxing certain design constraints to allow the $C_0$ term of the ISF of each stage to increase relative to the other coefficients of ISF, principally over the $C_N$ term, and compensating for this change by applying multiphase realignment to take advantage of the effects of MISF of the VCO ring as a whole. The VCO must be a multiphase VCO. Those with only one phase (such as Colpitts VCOs) cannot be realigned with the MISF effect. The number of phases determines the order of harmonic suppression. For example, for a three-stage ring oscillator, N=3, and the first two harmonic coefficients of the ISF, $C_1$ and $C_2$, are automatically suppressed in the MISF, since these harmonics are not a multiple of three. The trick then is obtaining $C_0 > Z \cdot C_3$, i.e., a non-null DC coefficient $C_0$ that is large enough relative to the next harmonic being expressed in the MISF, namely the third harmonic. In the present invention, this can be achieved using asymmetrical stages, in which the rise time of the oscillation waveform generated by an individual stage is different from the fall time of that oscillation waveform, which in turn results in a different phase shift response during those phases when the stage's oscillation waveform is rising from the phase shift response during those phases when the oscillation waveform is falling. A practical implementation of an asymmetrical VCO stage is described further below.

With reference to FIG. 6 the output phase shift due to realignment is a continuous and linear function of the detected phase error between the VCO output clock and a reference clock. The linear functions graphed in FIG. 6 are for an operating frequency of 160 MHz. The slope of each relationship is a realignment factor $\beta$. If $\Delta\phi$ represents the relative phase shift of the output clock $CK_{VCO}$ induced by a multiphase charge injection into the VCO ring stages, and $\Delta\theta$ represents the phase error prior to the realignment, then we can define a realignment factor $\beta = \Delta\phi/\Delta\theta$. The issue with the realignment factor arises in wide frequency range VCO circuits from the fact that its value tends to be dependent to some extent upon the VCO operating frequency. The use of the multiphase realignment technique of the present invention allows matching of the relative charge injection quantity with the VCO bias current, which results in a more stable amplitude of $\beta$ over a wide frequency range. The realignment factor $\beta$ is controlled by increasing the realignment pulse amplitude $I_{ALIGN}$ proportionally to the VCO bias current $I_{BIAS}$ ($=G_m \cdot V_{CONTROL}$). FIG. 6 illustrates that we can keep the realignment factor $\beta$ relatively constant over a range of fabrication processes.

FIG. 7A illustrates the basic principal of operation of a VCO ring stage having the requisite non-null DC value $C_0 > Z \cdot C_N$ for the MISF. The oscillation waveform provided by each stage in the VCO ring can be asymmetric, i.e., with the rise time different from the fall time. In relaxation and ring oscillators, the oscillation basically consists in alternately charging and discharging a load capacitance $C_{LOAD}$. Current source elements 51 and 54 of the stages' circuitry conduct respective charging and discharging currents $i_{charge}$ and $i_{discharge}$ to or from the capacitor $C_{LOAD}$ through respective control switches 52 and 53. (Note: In some circuit embodiments, current conduction and switching may be carried out by the same element, such as by an MOS transistor.) To get the rise and fall times to differ, the charging current $i_{charge}$ must be different from the discharging current $i_{discharge}$.

In FIG. 7B, an exemplary CMOS embodiment of the basic circuitry outlined in FIG. 7A uses a fixed charging current, $i_{charge} = G_{mp} \cdot V_{CONTROL}$, provided by a PMOS transistor 61 whose gate 64 is biased by a constant voltage control $V_{CONTROL}$; whereas the discharge current, $i_{discharge} = G_{mn} \cdot V_N$, is a variable current that depends upon the oscillation input voltage $V_N$ supplied to the gate 66 of an NMOS transistor 63. A cascade PMOS transistor 62 biased by a cascode voltage $V_{CASCODE}$ may be provided in the charging path to govern the injection of any realignment current pulses $i_{ALIGN}$ supplied from an input node 67 located between the transistors 61 and 62. A slow-rise, quick-fall oscillation waveform is propagated onto a capacitive output line 68 having a load capacitance $C_{LOAD}$. This construction of an inverting stage for a VCO circuit is not limited only to CMOS implementations, but can be extended to other circuit technologies including other MOS designs and BJT implementations. Provided the VCO stages have such asymmetrical waveforms and at least two phases, the multiphase realignment effect can be implemented. The best VCO circuit constructions for multiphase realignment are single-ended ring VCOs, differential ring VCOs, differential relaxation VCOs and phase-shift RC VCOs. Any of these can be adapted for multiphase realignment in accord with the present invention.

Figure 8:
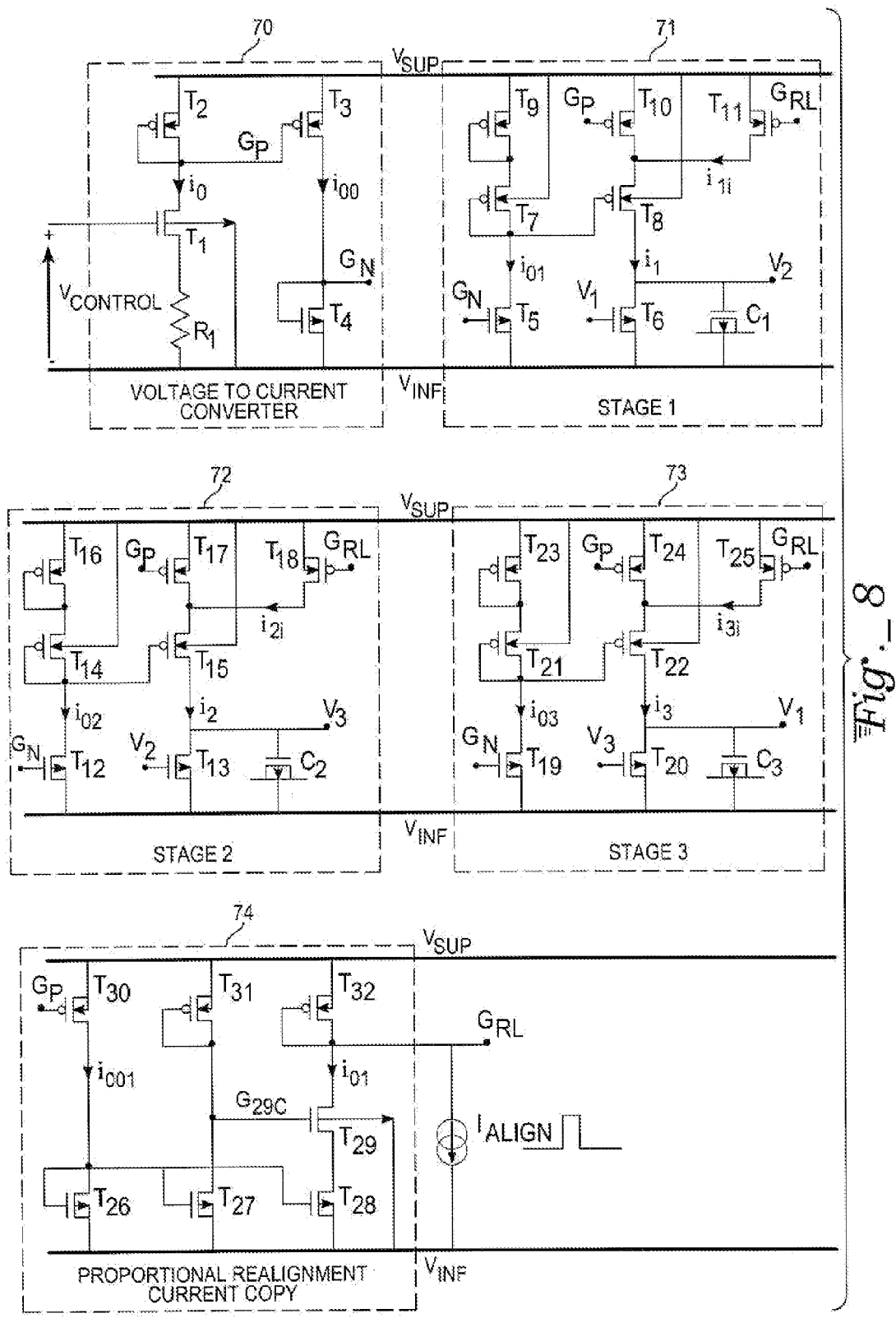
FIG. 8 is an exemplary transistor-level schematic circuit diagram of an exemplary ring VCO circuit embodiment in accord with the present invention. For simplicity, common signal labels ($G_P$, $G_N$, $G_{RL}$, $V_1$, $V_2$, $V_3$) indicate the various connections between the VCO circuit elements.
Figure 9:
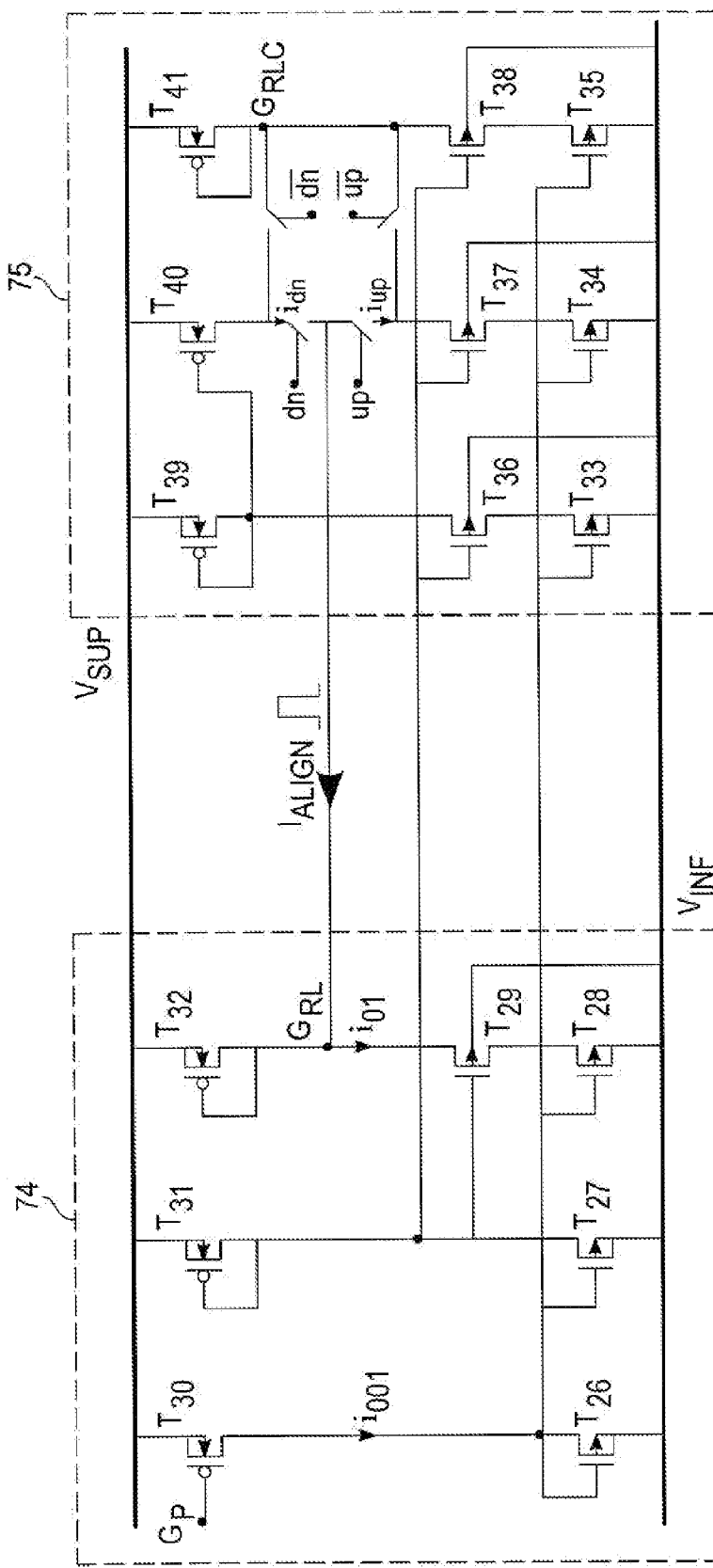
FIG. 9 shows an exemplary charge pump circuit for providing the proportional injection current pulse $I_{ALIGN}$ to the ring VCO of FIG. 8.

FIG. 8 shows an exemplary embodiment of one such VCO circuit in accord with the present invention. What is shown is a more detailed example of the ring VCO in FIG. 1. The number of ring stages can be varied. This embodiment is based on cascoded NMOS inverter stages. One could, if desired, modify this embodiment to use CMOS inverter stages, but the resulting VCO would be slower and more sensitive to ripple in the supply voltage $V_{SUP}$. The present invention could also be constructed using bipolar or other integrated circuit types. In another variation, one might inject the realignment current differentially instead of using $I_{ALIGN}$ pulses. The distributed charge injection technique of the present invention might also be applied to stages of an LC oscillator, instead of the one shown here that uses inverter stages. FIG. 9 shows an exemplary charge pump circuit for providing the proportional injection $I_{ALIGN}$ to the ring VCO of FIG. 8.

In FIG. 8, a voltage-to-current converter 70 receives a control voltage $V_{CONTROL}$ at the gate of NMOS transistor T1 for controlling the oscillating frequency of the VCO circuit. The resistor R1 converts $V_{CONTROL}$ minus the threshold voltage of transistor T1 to a proportional current $i_0$. In a specific embodiment, transistor T1 has a large gate channel width/length ratio and works slightly above the threshold region. Transistors T2, T3, and T4 form mirror current reference devices for establishing gate voltages $G_P$ and $G_N$ to be applied to matching transistors in the VCO ring stages 71, 72, and 73. PMOS transistors T2, T3, T10, T17, and T24 are matched to each other and share the same source and gate voltages, $V_{SUP}$ and $G_P$. Likewise, NMOS transistors T4, T5, T12, and T19 are matched to each other and share the same source and gate voltages $V_{INF}$ and $G_N$. In this way, currents $i_1$, $i_2$ and $i_3$ will be matched to the reference current $i_0$ established by $V_{CONTROL}$, and the bias currents $i_{01}$, $i_{02}$, and $i_{03}$ will match the corresponding current $i_{00}$ in the voltage-to-current converter 70. The gate channel widths and lengths are chosen to be large enough to obtain good matching.

The drain voltages of the PMOS transistors T10, T17, and T24 in the stages 71, 72, and 73 are made stable owing to the cascode transistors T8, T15, and T22. These cascode transistors have a gate voltage that follows the variations in the supply voltage $V_{SUP}$, which improves the power supply rejection ratio of the VCO circuit. The $V_{SUP}$-to-gate voltage of cascode transistor T8 is determined by the sum of the gate-to-source voltages of transistors T7 and T9 biased by the current $i_{01}$ (matched to $i_{00}$). The $V_{SUP}$-to-gate voltages of cascode transistors T15 and T22 are determined in the same manner, with transistors T14, T16, T21, and T23. The fact that transistors T10, T17, and T24 can be slow (due to their large channel lengths to ensure good matching with T2) does not impact the VCO speed. This rather depends on the speed of the cascode transistors T8, T15, and T22. Accordingly, for fast operation these cascode transistors have the shortest channel lengths of all the transistors in the circuit.

Capacitors C1, C2, and C3 in the inverting stages 71, 72, and 73 are used for tuning the VCO frequency range.

A proportional realignment current copy subcircuit 74 provides a realignment voltage input $G_{RL}$ by means of a PMOS transistor T32 to realignment current copy transistors T11, T18, and T25 in the inverter stages 71, 72, and 73. The realignment currents $i_{1i}$, $i_{2i}$, and $i_{3i}$ through the transistors T11, T18, and T25 are copies of the current $i_{01}$ through transistor T32. However, the precise matching of transistors T11, T18, and T25 to transistor T32 is not critical, since the multiphase impulse sensitivity response function (MISF) is not very sensitive to small differences in the realignment currents. Indeed, this low sensitivity is good from a design standpoint, because the current copy transistors T11, T18, T25, and T32 need to be made with the shortest gate length and the smallest possible gate width in order to be able to copy the very short current pulses $I_{ALIGN}$.

The realignment current $i_{01}$ has both a DC component copied from mirrored NMOS transistors T26 and T28 ($i_{00i}$) and a pulsed component $I_{ALIGN}$ delivered by a charge pump. Both components, $i_{00i}$ and $I_{ALIGN}$, are proportional to the VCO bias current $i_0$ established in the voltage-to-current converter 70. This allows one to realize a small-spread realignment factor β versus the VCO bias current $i_0$ and thus versus its operating frequency. The DC component, $i_{00i}$, may typically equal about 20% of $i_0$, while the pulsed component, $I_{ALIGN}$, may typically equal about 10% of $i_0$. A realignment charge pump 75, described below with reference to FIG. 9, provides $I_{ALIGN}$, which is a positive pulse whenever the VCO output phase is less than (lags) the reference phase, and a negative pulse whenever the VCO output phase is greater than (leads) the reference phase. This realignment pulse causes the phase of the VCO clock output to be accelerated or decelerated, as needed, so as to align the VCO clock output with the reference clock.

Finally, an NMOS cascode transistor T29 is coupled to the transistor T28 in the current copy subcircuit 74 in order to reduce the parasitic charge injection induced by the intrinsic output capacitances $C_{gd}$ and $C_{ds}$ of transistor T28. Like the other current copy transistors T11, T18, T25, and T32, the cascode transistor T29 also is made with the shortest gate length and smallest possible gate width in order to quickly response to the very short $I_{ALIGN}$ current pulses.

With reference to FIG. 9, the proportional realignment current copy subcircuit 74 receives the $I_{ALIGN}$ current pulses from a charge pump subcircuit 75. As already noted, the amplitude of the pulses should be proportional to the VCO bias current $i_0$. The sign should be positive when the VCO output phase is smaller than (lags) the reference clock phase. The pulse width should equal the time delay between the VCO output clock edge and the reference clock edge. In FIG. 9, a conventional phase-frequency detector circuit (PFC), not shown, but well known in the art, provides the up and down signals, up and dn, and their complements, to a set of switches, which open or close according to the state transition diagram in FIG. 10 and the signal waveform diagram in FIG. 11. Any PFC circuit that operates as in FIGS. 11 and 12, can be used. For example, the PFC circuit could be implemented using RS flip-flops based on elementary NAND gates.

The transistors T33 through T41 constitute the impulse charge generator which selectively couple the supply lines $V_{SUP}$ and $V_{INF}$ to the realignment pulse line $G_{RL}$ by the up and down signals to generate the realignment pulses $I_{ALIGN}$. Whenever signal up is high and dn is low, the current $i_{up}$ through transistors T37 and T34 is driven to node $G_{RL}$, while the current $i_{dn}$ through transistor T40 is driven to a waste node $G_{RLC}$. This increases the current through transistor T32 and thus injects a positive current pulse into all of the VCO stages 71, 72, and 73 via copy transistors T11, T18, and T25, instantly accelerating the VCO. Oppositely, whenever the signal up is low and dn is high, the current $i_{dn}$ is driven to node $G_{RL}$, while $i_{up}$ is driven to the waste node $G_{RLC}$. This decreases the current through transistor T32 and thus injects a negative current pulse into all of the VCO stages 71, 72, and 73 via the copy transistors T11, T18, and T25, instantly decelerating the VCO.

The magnitudes of the currents $i_{up}$ and $i_{dn}$ are both about equal to one-half of the magnitude of the current $i_{0i}$. The transistors T33, T34, and T35 are all matched in their gate channel lengths with transistor T26, but their gate widths are designed so as to ensure the current magnitudes are approximately $i_{up}=i_{dn}=\frac{1}{2} \cdot i_{0i}$. Cascode transistors T36, T37, and T38 for the respective transistors T33, T34, and T35 minimize any parasitic charge injection due to the up and down switches.

Figure 10:
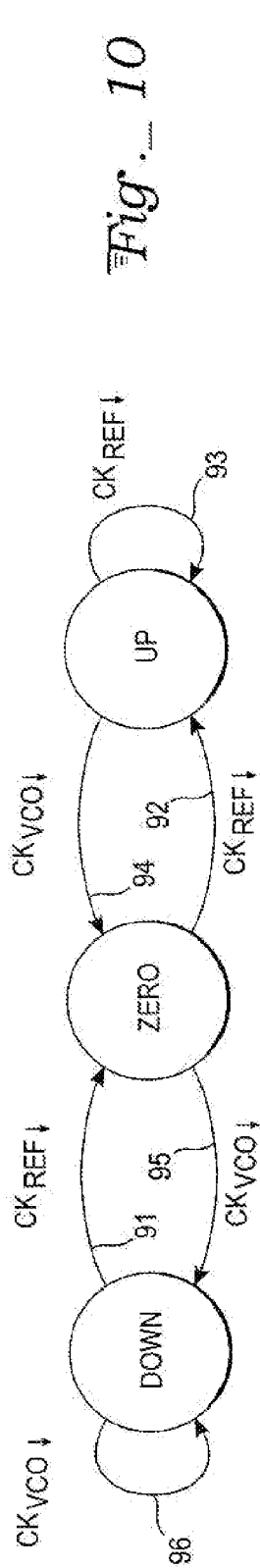
FIG. 10 is a state transition diagram for a phase-frequency detector circuit (PFC) state machine providing the complementary up and down signals to the switches in the charge pump circuit of FIG. 9.
Figure 11:
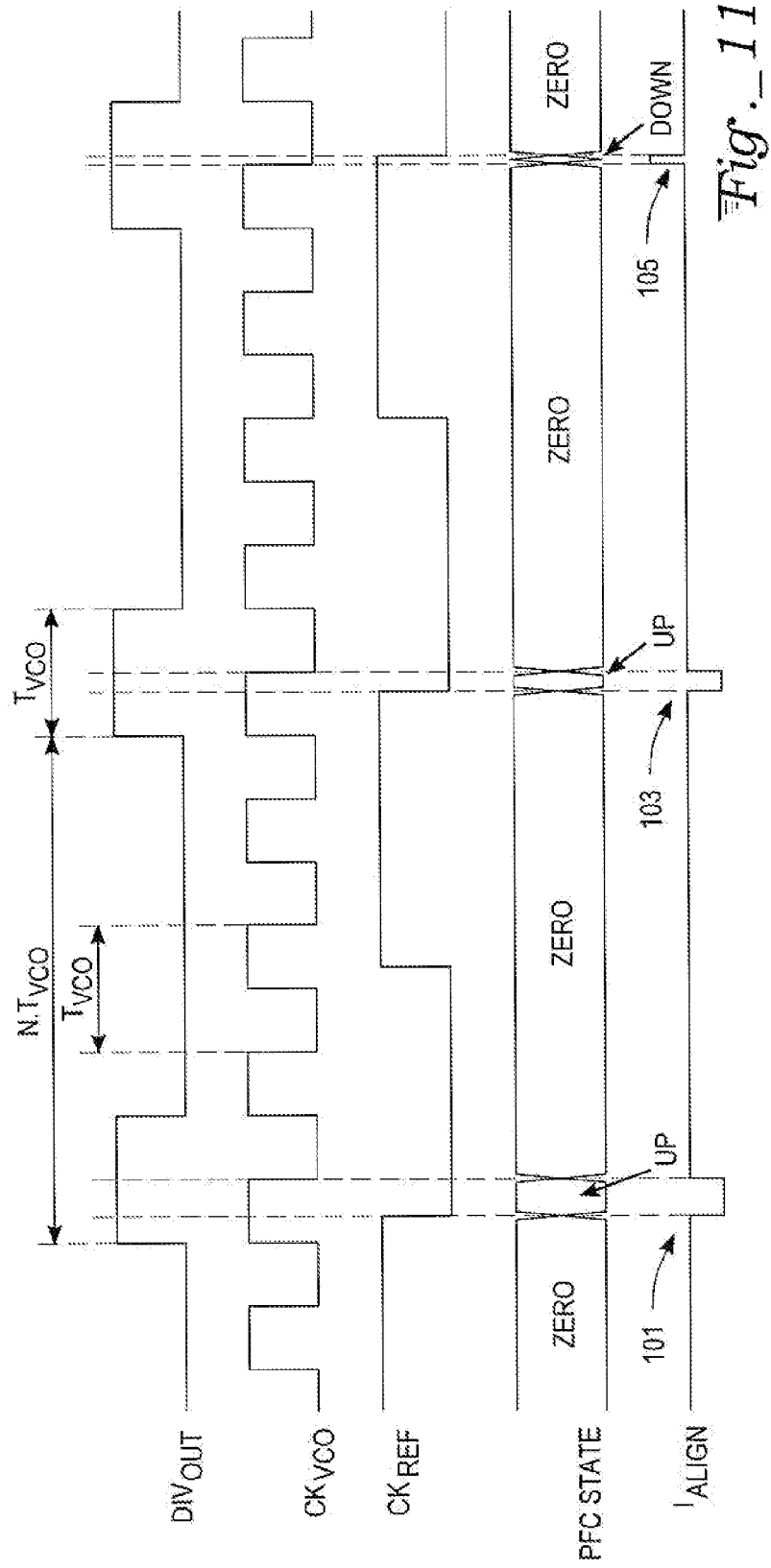
FIG. 11 is a signal waveform diagram for the PFC state machine responsive to the VCO clock output $CK_{VCO}$ and reference clock $CK_{REF}$ to generate in the charge pump circuit a positive or negative current impulse $I_{ALIGN}$ of appropriate width.

With reference to FIGS. 10 and 11, an exemplary phase-frequency detector circuit that can be used with the present invention may be sensitive to the falling edges of the VCO clock output $CK_{VCO}$ and of the reference clock $CK_{REF}$. $CK_{VCO}$ may be masked by a signal $CK_{DIV}$, which represents the frequency subdivision of $CK_{VCO}$ obtained by a digital frequency divider working on $CK_{VCO}$'s rising edge, as illustrated in FIG. 11. The phase detection is then made only after each N VCO clock periods, or one reference clock period, where N is the multiplication factor between the VCO output clock frequency and the reference clock frequency.

At each falling edge of $CK_{REF}$: (a) if the existing PFC state is DOWN, then the PFC transits (91) to state is ZERO, (b) if the existing PFC state is ZERO, the PFC transits (92) to state UP; and (c) if the PFC state is UP, then the PFC keeps the same state (93). At each falling edge of $CK_{VCO}$, while $CK_{DIV}$ is high: (a) if the existing PFC state is UP, then the PFC transits (94) to state ZERO; (b) if the existing PFC state is ZERO, then the PFC transits (95) to state DOWN; and (c) if the existing PFC state is DOWN, the PFC keeps the same state (96). In state ZERO, signals up and dn are both reset low to 0. In state UP, signal up is set high to 1, while signal dn is reset low to 0. In state DOWN, signal up is reset low to 0, while signal dn is set high to 1. As already noted, the up and dn signals determine the current impulse $I_{ALIGN}$ generated by the charge pump circuit 75 in FIG. 9.

Resulting waveforms can be seen in FIG. 11. Note that the width of the current impulse $I_{ALIGN}$ is proportional to the phase difference between $CK_{VCO}$ and $CK_{REF}$, being wider, for example, at phase detection event 101 than at either events 103 or 105. Where the current impulse is negative (e.g. at 101) due to an UP event, the VCO phase is accelerated, which provides a shorter duration UP state at the next phase detection 103, and eventually a DOWN state at detection event 105. The current impulse is positive (e.g. at 105) due to a DOWN event, causing the VCO phase to decelerate. In this manner, the VCO output clock phase continuously tends toward the phase of the reference clock $CK_{REF}$.

Figure 12:
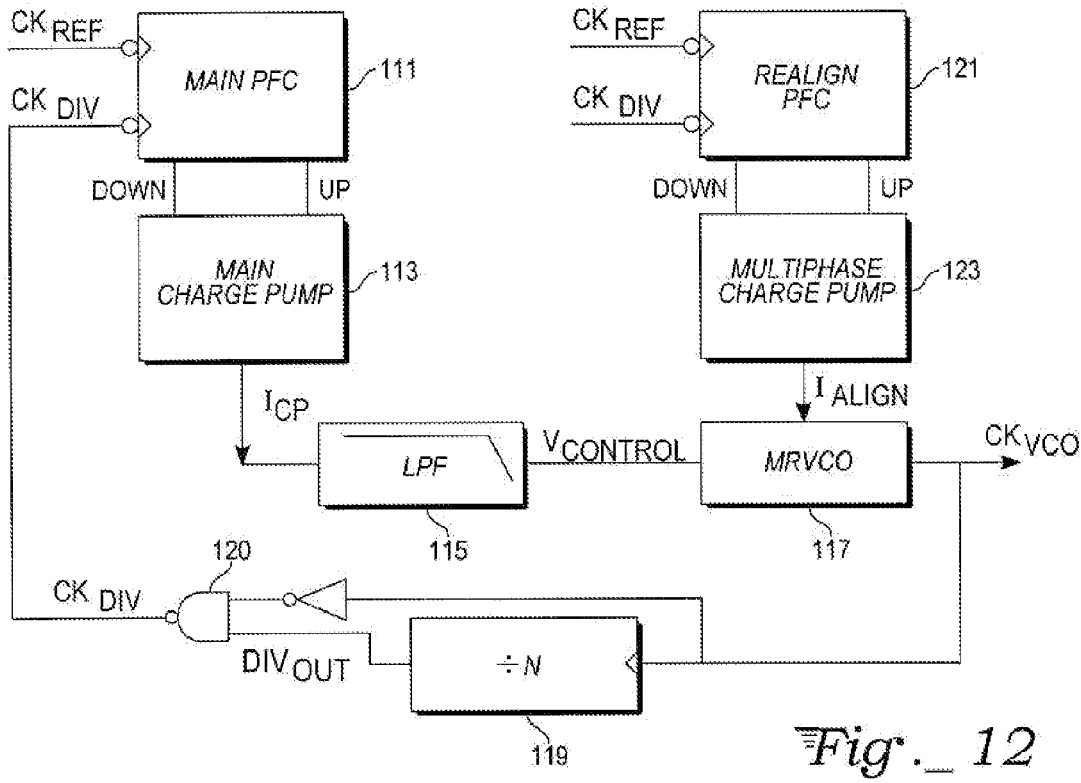
FIG. 12 is a schematic block diagram of a PLL circuit employing a multiphase realigned VCO circuit of the present invention.

With reference to FIG. 12, the multiphase realigned VCO circuit of the present invention may be employed in a phase-locked loop (PLL) circuit, resulting in a significant reduction in phase noise or jitter. The multiphase realigned PLL circuit uses a principal loop comprising a main phase-frequency detection circuit (PFC) 111, a main charge pump 113, a low pass filter 115, a multiphase realigned VCO circuit 117 like that described above, and a divide-by-N frequency divider 119. The PLL circuit also includes a realignment phase-frequency detection circuit (PFC) 121 and a multiphase realignment charge pump 123 in order to feed the VCO circuit 117 with the realignment current impulse $I_{ALIGN}$. Both PFC circuits 111 and 121 act at the falling edges of signals $CK_{REF}$ and $CK_{DIV}$, as in FIGS. 10 and 11, which means, taking into account the signal gating using the NAND gate 120, that they directly detect the phase difference between the reference clock signal $CK_{REF}$ and the $N^{th}$ clock edge of the VCO clock output $CK_{VCO}$. The use of two separate PFC circuits 111 and 121 and two separate charge pumps 113 and 123 allow mutual phase correction mechanisms: (a) a primary phase regulation ($V_{CONTROL}$) at low speed for the main loop, via main PFC and charge pump circuits 111 and 113, and (b) a feed-forward phase correction ($I_{ALIGN}$), via the multiphase realignment PFC and charge pump circuits 121 and 123.

Figure 13:
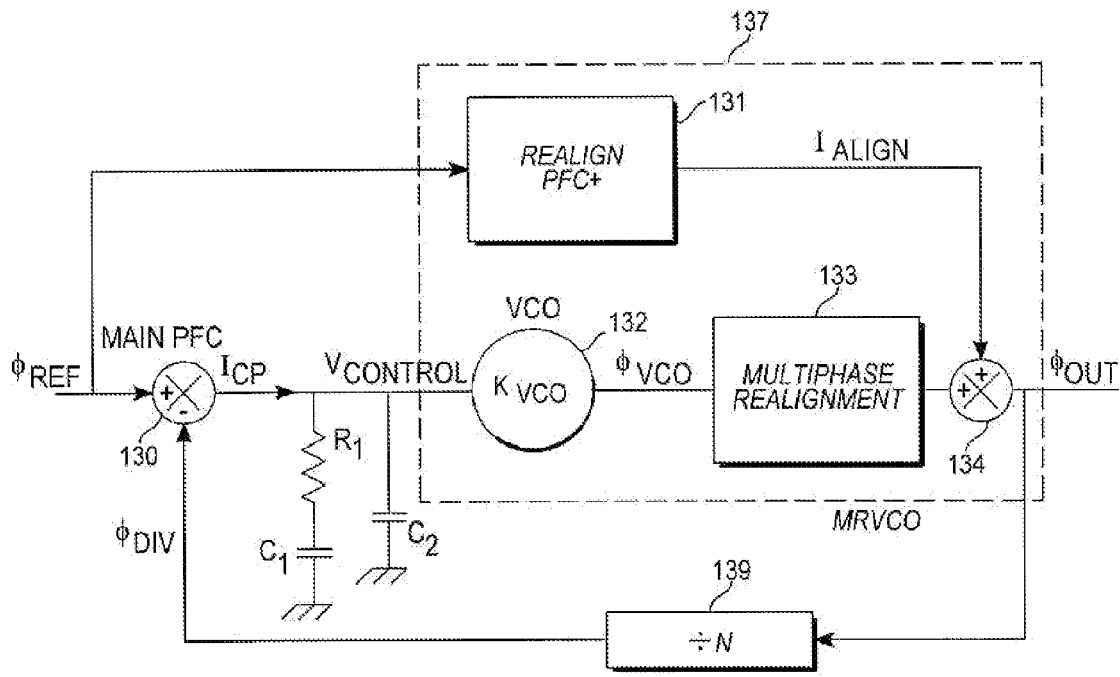
FIG. 13 is a linear phase model of the PLL circuit in FIG. 12 for use in estimating phase modulation noise.

With reference to FIG. 13, in an equivalent synoptic model for the multiphase realigned PLL circuit of FIG. 12, the signals are replaced by their absolute phases in order to illustrate the impact of the phase regulation loop on the final PLL phase noise. The phase summing node 130 represents the main PFC circuit 111 and associated main charge pump 113 to provide a low-frequency charge pump output current $I_{CP}$ that depends on the phase relationship ($\phi_{REF}$-$\phi_{DIV}$) between the divided VCO output and reference clocks. The low pass filter 115 is represented by a resistor R1 and two capacitors C1 and C2, and provides a $2^{nd}$ order phase advance correction that results in the control voltage $V_{CONTROL}$. An alternate filter architecture using a simple integrator and a single capacitor could be used instead. The multiphase realigned VCO circuit 117 and associated realignment PFC circuit 121 and charge pump 123 are represented by the phase elements 131 through 134 inside dashed box 137. While the low-frequency $V_{CONTROL}$ signal in the main loop provides long-term frequency and phase stability to the VCO (i.e., over multiple cycles); $I_{ALIGN}$ pulses from the multiphase realignment PFC and charge pump components provide instant phase changes to the VCO output whenever needed, as represented by the phase summation node 134. In the main loop, the VCO output phase $\phi_{OUT}$, when divided by the divide-by-N component 119, represented by divider 139, generates the $\phi_{DIV}$ phase that is used for comparison with $\phi_{REF}$ in the main PFC circuit.

Figure 14:
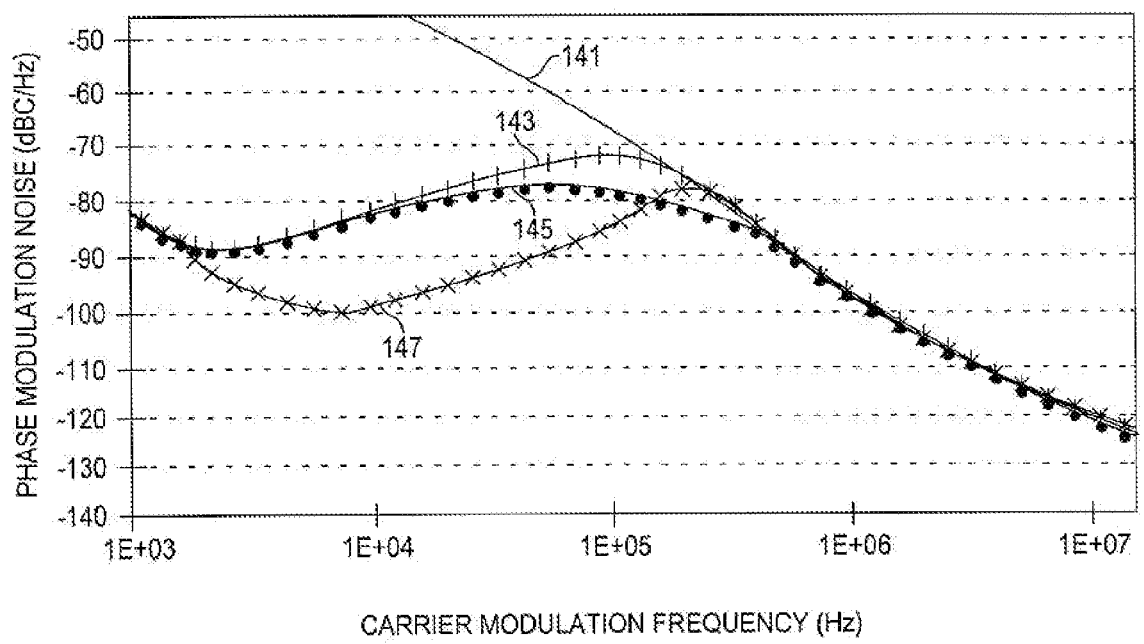
FIG. 14 is a graph of phase modulation noise (in dBc/Hz) versus carrier modulation frequency (in Hz) for a multiphase realigned VCO circuit as in FIG. 8, for a representative PLL circuit of the prior art without multiphase realignment, and multiphase realigned PLL circuits as in FIGS. 12 and 13 with various low-pass filters and characterized by a small (0.1) realignment factor β.

Using this phase model, the VCO phase noise versus modulation frequency around a carrier can be estimated by a simulator employing a periodic steady state method. FIG. 14 shows results for such phase noise estimation for the PLL circuit of FIGS. 12 and 13, where a single sideband spectral power density relative to carrier signal power (in dBc/Hz) expresses the phase modulation noise. For reference, the nearly linear curve 141 estimates the intrinsic phase modulation noise of the multiphase realigned VCO of the present invention, by itself. The curve 143 shows the estimated phase noise for a PLL without the phase realignment of the present invention. The curve 145 shows the estimated phase noise for a multiphase realigned PLL circuit as in FIGS. 12 and 13, using a (R1, C1, C2) low-pass filter, but with a very small (0.1) realignment factor β. Note that even with this small β, there is an improvement of up to 5 dB over prior PLL circuits. For any PLL circuit of this type, the realignment factor can be optimized for lowest phase noise using such stimulations. Curve 147 shows the estimated phase noise for a multiphase realigned PLL circuit as in FIG. 12 using a simple integrating capacitor C2 as the low-pass filter. The significant noise improvement shows that with the multiphase realigned VCO in the loop it is no longer necessary to use a zero-phase correction (R1-C1) in such PLL circuits. The simple integrating capacitor allows better performance without degrading the stability conditions of the loop due to the feed-forward realignment.

What is claimed is:

1. A free-running oscillating system externally synchronized in phase to a reference oscillation by multiple impulses, the oscillating system comprising:

a plurality N of individual stages coupled together so as to produce an oscillating signal at a target frequency, at least a plurality of the stages coupled to receive in parallel a set of realignment impulses effective to cause a phase shift of the oscillating signal, the realignment impulses being applied to stages separated by equal phase distribution;

wherein each of the stages presents a periodic impulse sensitivity response which, in a Fourier domain, has a magnitude of a DC coefficient that is at least twice that of an $N^{th}$ harmonic coefficient, and wherein the plurality of stages, for which the realignment impulses are applied in parallel with equal phase distribution, collectively present a multiphase impulse sensitivity response which, in a Fourier domain, has suppressed $1^{st}$ through $(N-1)^{st}$ harmonic coefficients, is by construction strictly of one sign and substantially constant over a full phase period.

2. The oscillating system as in claim 1, wherein the multiphase impulse sensitivity response being, by construction, substantially constant permits the realignment impulses to be applied to the stages at any instant regardless of the phase of the oscillating signal.

3. The oscillating system as in claim 1, wherein the plurality of stages are voltage-controlled electronic inverter circuits receiving a bias current for establishing an oscillating voltage signal at the target frequency, the plurality of applied realignment impulses being current impulses proportional to the bias current and proportional to a phase difference between the oscillating voltage signal and a reference phase.

4. A multiphase-realigned voltage-controlled oscillator (VCO) circuit, comprising:

a plurality N of individual inverting stages coupled together so a to provide an oscillating voltage signal, the inverting stages coupled to receive a VCO bias current establishing an oscillation frequency of the oscillating voltage signal, at least a plurality of the inverting stages further coupled to receive in parallel realignment current impulses effective to cause a phase shift of the oscillating voltage signal, the realignment current impulses being proportional to the VCO bias current and proportional to a phase difference between the oscillating voltage signal and a reference phase, and the realignment current impulses being applied to inverting stages separated by equal phase distribution;

wherein each of the inverting stages presents a periodic impulse sensitivity response which, in a Fourier domain, has a magnitude of a DC coefficient that is at least twice that of an $N^{th}$ harmonic coefficient, and wherein the plurality of inverting stages, for which the realignment current impulses are applied in parallel with equal phase distribution, collectively present a multiphase impulse sensitivity response which, in a Fourier domain, has suppressed $1^{st}$ through $(N-1)^{st}$ harmonic coefficients, is by construction strictly of one sign and substantially constant over a full phase period.

5. The VCO circuit as in claim 4, wherein the realignment current impulses are applied to each of the N inverting stages.

6. The VCO circuit is in claim 4, wherein the realignment current impulses are applicable to the inverting stages at any instant at which a phase difference is detected between the oscillating voltage signal and a reference phase, regardless of the phase of the oscillating voltage signal.

7. The VCO circuit as in claim 4, wherein the inverting stages generate an asymmetric oscillating waveform with different rise and fall times.

8. The VCO circuit as in claim 4, further comprising a phase-frequency detection circuit configured to compare the oscillating voltage signal with a reference clock signal and a charge pump for producing the realignment current impulses in response to the comparison by the detection circuit, whereby the VCO forms a component of a phase-locked loop circuit, the multiphase impulse sensitivity response being, by construction, substantially constant permitting the realignment current impulses to be applied regardless of skew between the oscillating voltage signal and the reference clock.

9. A multiphase-realigned voltage-controlled oscillator (VCO) circuit, comprising:
  a plurality of inverting stages coupled together in series into a ring, each of these inverting stages in the ring providing an oscillating voltage signal to the next stage in the ring with a relative phase delay between the stages automatically adjusting itself according to the number of stages in the ring, each inverting stage in the ring responsive to a control voltage input to provide a long-term adjustment of propagation time delay through each inverting stage in the ring and hence adjusting the oscillating frequency of the ring to a target frequency, the oscillating voltage signal from each inverting stage in the ring having an asymmetric waveform wherein a rise time of the oscillating voltage signal differs from a fall time of the oscillating voltage signal; and
  an output stage coupled to an output of one of the inverting stages, the output stage configured to provide a VCO clock output;
  wherein each of the inverting stages in the ring is further coupled to receive in parallel a realignment current impulse, these inverting stages responsive to said realignment current impulse effective to immediately shift the phase of the oscillating voltage signal output from each stage, with a multiphase impulse sensitivity function, representing a phase realignment response of the VCO clock output to the realignment current impulse applied in parallel to the plurality of inverting stages in the ring, being both strictly of one sign and substantially constant such that an overall phase realignment of the VCO clock output is achieved after a relative phase readjustment between the stages.

10. The VCO circuit as in claim 9, wherein each of the inverting stages comprises a charging current source element and a discharging current source element, both coupled to an output line of the inverting stage with a load capacitance, the charging current source element biased by a constant voltage control, the discharging current source element biased by an oscillating voltage input, wherein each of the inverting stages is characterized by a slower-rise, quicker-fall oscillation waveform.

11. The VCO circuit as in claim 10, wherein the charging and discharging current source elements are respective PMOS and NMOS transistors coupled between a power supply voltage line and ground reference voltage line.

12. The VCO circuit as in claim 11, wherein each of the inverting stages, further comprises a cascode MOS transistor coupled between the PMOS transistor that forms the charging current source element and the output line of the inverting stage, and a realignment current pulse input line coupled between the PMOS transistor and the cascode MOS transistor.

13. The VCO circuit a in claim 9, wherein a voltage-to-current converter is coupled to receive the control voltage and supplies a mirrored bias current $i_0$ proportional to said control voltage to each of the inverting stages so as to establish the propagation time delay through each inverting stage.

14. The VCO circuit of claim 13, wherein a realignment current copy subcircuit is coupled to receive the realignment current impulse and to provide copies thereof to current copy transistors within each of the inverting stages, such that the copied realignment current impulse is superimposed upon the mirrored bias current $i_0$.

15. The VCO circuit as in claim 9, further comprising:
  a phase detector circuit coupled to receive and compare a stable reference clock signal and the VCO clock output, the phase detector circuit providing up/down control signals that are dependent upon whether the VCO clock output lags or leads the reference clock signal; and
  a charge pump circuit coupled to receive the up/down control signals from the phase detector circuit and operative to produce the realignment current impulse.

16. The VCO circuit as in claim 15, wherein the realignment current impulse has a peak amplitude proportional to the control voltage, has a positive or negative sign that is dependent upon whether the VCO clock output lags or leads the reference clock signal, and has a pulse width corresponding to the relative phase difference between the reference clock signal and the VCO clock output, whereby a substantially constant realignment factor is obtained for each realignment current impulse.

17. The VCO circuit as in claim 9, further comprising:
  a divide-by-N circuit coupled to receive the VCO clock output and to act upon VCO clock edges to generate a divided clock signal of $1/N^{th}$ frequency relative to the VCO clock output;
  a main phase-frequency detection circuit configured to compare an average frequency of the divided clock signal with that of a stable reference clock over a plurality of clock cycles and to generate long-term up/down control signals as a result of such comparison; and
  a main charge pump and a low pass filter configured to produce the control voltage input to the VCO circuit in response to the long-term up/down control signals, whereby the VCO circuit forms a component of a phase-locked loop circuit.

18. The VCO circuit formed as a component of a phase-locked loop circuit as in claim 17, further comprising:
  a second phase-frequency detection circuit comparing the relative phase of the divided clock signal with that of the stale reference clock to generate phase realignment up/down control signals as a result of such comparison; and
  a realignment charge pump producing realignment current impulses in response to the realignment up/down control signals, the realignment current impulses being applicable to the plurality of inverting stages at any instant, regardless of any skew between the divided clock signal and the stable reference clock.

19. A method of realigning a phase of a clock output provided by a voltage-controlled oscillator of the type having a plurality of inverting stages coupled together in series in a ring, the phase realigning method comprising:

provided that each of the inverting stages in the ring produces an oscillating voltage signal with an asymmetric waveform wherein rise and fall times of the oscillating voltage signal differ; and applying a realignment current impulse in parallel to each of the inverting stages in the ring, the realignment current impulse effective to immediately shift the phase of the oscillating voltage signal produced from each stage, wherein a multiphase impulse sensitivity function that represents a phase realignment response to the realignment current impulse of the clock output provided by the voltage-controlled oscillator is both strictly of one sign and substantially constant for all phases of the clock output.

20. The method as in claim 19, wherein the realignment impulses are applied to the inverting stages as needed at any instant regardless of the phase of the oscillating voltage signal.

21. The method as in claim 19, wherein the asymmetric waveform characteristic of each inverting stage provided in the ring is a slower-rise, quicker-fall oscillation waveform generated by providing a substantially constant charging current to a capacitive output line of the inverting stage and a discharging current from the output line that is dependent on an oscillating voltage input from a preceding inverting stage of the ring.

22. The method as in claim 21, wherein the realignment current impulse is applied as an additional charging current to the output line of each stage.

23. The method as in claim 19, further comprising:

monitoring the clock output provided by the voltage-controlled oscillator and comparing the clock output with a reference clock signal; and generating the realignment current impulse with a sign dependent upon whether the clock output lags or leads the reference clock signal.

24. The method as in claim 23, wherein the realignment current impulse is generated with a pulse width that corresponds to a relative phase difference between the clock output from the voltage-controlled oscillator and the reference clock signal.

25. The method as in claim 23, wherein the generated realignment current impulses are applied to the inverting stages as needed regardless of any skew between the clock output and the reference clock signal.

* * * * *

UNITED STATES PATENT AND TRADEMARK OFFICE
CERTIFICATE OF CORRECTION

PATENT NO. : 7,339,439 B2
APPLICATION NO. : 11/456752
DATED : March 4, 2008
INVENTOR(S) : Roubadia et al.

It is certified that error appears in the above-identified patent and that said Letters Patent is hereby corrected as shown below:

On the face page, in field (75), in "Inventors", in column 1, line 2, delete "Marseilles" and insert -- Marseille --, therefor.

In column 1, line 19, delete "itself." and insert -- thereof. --, therefor.

In column 1, line 27, delete "band width." and insert -- bandwidth. --, therefor.

In column 1, line 33, delete "bandwith" and insert -- bandwidth --, therefor.

In column 5, line 11, delete "capacities" and insert -- capacitance --, therefor.

In column 5, line 15, delete "$ISF(t)=(\Delta\Phi(t)/\Delta q \cdot i_L(t)dt,$" and insert
-- $ISF(t)=(\Delta\Phi(t)/\Delta q) \cdot i_L(t)dt,$ --, therefor.

In column 5, line 47, delete "(0to" and insert -- (0 to --, therefor.

In column 5, line 58, delete "$ISF_k(t)$" and insert -- $ISF_k(t)$ --, therefor.

In column 6, line 16, delete "Nm" and insert -- N·m --, therefor.

In column 7, line 15, after "FIG. 6" insert -- , --.

In column 7, line 60, delete "cascade" and insert -- cascode --, therefor.

In column 9, line 41, delete "response" and insert -- respond --, therefor.

In column 10, line 31, after "state" delete "is".

In column 10, line 31, after "ZERO" delete "," and insert -- ; --, therefor.

In column 11, line 62, delete "stimulations." and insert -- simulations. --, therefor.

In column 12, line 42, in Claim 4, delete "a" and insert -- as --, therefor.

UNITED STATES PATENT AND TRADEMARK OFFICE
CERTIFICATE OF CORRECTION

PATENT NO. : 7,339,439 B2
APPLICATION NO. : 11/456752
DATED : March 4, 2008
INVENTOR(S) : Roubadia et al.

It is certified that error appears in the above-identified patent and that said Letters Patent is hereby corrected as shown below:

In column 14, line 6, in Claim 13, after "circuit" delete "a" and insert -- as --, therefor.

In column 14, line 57, in Claim 18, delete "stale" and insert -- stable --, therefor.

Signed and Sealed this

First Day of July, 2008

JON W. DUDAS
*Director of the United States Patent and Trademark Office*